US009511388B2

(12) United States Patent
Tryon et al.

(10) Patent No.: US 9,511,388 B2
(45) Date of Patent: Dec. 6, 2016

(54) METHOD AND SYSTEM FOR HOLDING A COMBUSTOR PANEL DURING COATING PROCESS

(71) Applicant: UNITED TECHNOLOGIES CORPORATION, Hartford, CT (US)

(72) Inventors: Brian S. Tryon, Glastonbury, CT (US); Kevin Joseph Low, Portland, CT (US); James P. Bangerter, Manchester, CT (US); Russell A. Beers, Manchester, CT (US); Alexander W. Williams, Windsor Locks, CT (US)

(73) Assignee: United Technologies Corporation, Farmington, CT (US)

( * ) Notice: Subject to any disclaimer, the term of this patent is extended or adjusted under 35 U.S.C. 154(b) by 300 days.

(21) Appl. No.: 13/723,542

(22) Filed: Dec. 21, 2012

(65) Prior Publication Data

US 2014/0173896 A1 Jun. 26, 2014

(51) Int. Cl.

| | |
|---|---|
| ***B23P 17/00*** | (2006.01) |
| ***B23P 25/00*** | (2006.01) |
| ***B23P 6/00*** | (2006.01) |
| ***B05C 13/00*** | (2006.01) |
| ***B05C 13/02*** | (2006.01) |
| ***B05B 13/02*** | (2006.01) |
| *C23C 16/00* | (2006.01) |
| *C23C 4/00* | (2016.01) |
| *B22D 19/00* | (2006.01) |
| *C23C 4/12* | (2016.01) |

(52) U.S. Cl.
CPC ........... *B05B 13/0285* (2013.01); *B05C 13/02* (2013.01); *B22D 19/00* (2013.01); *C23C 4/12* (2013.01); *Y10T 29/49234* (2015.01)

(58) Field of Classification Search
CPC ............ B05C 13/02; C23C 4/127; C23C 4/12; C23C 4/124; C23C 4/02; C23C 16/509; C23C 16/18; C23C 16/06; B05B 7/226; B05B 13/0285; B05B 13/0292; B23P 15/00; B25B 11/02; B22C 5/00; B22D 19/00; B22D 11/128; Y10T 29/49234
USPC ..... 29/418, 559, 527.1, 527.2, 527.3, 527.5, 29/527.6, 889.1–889.722; 427/446, 457, 29/569, 427/248.1; 164/46, 98; 118/728, 118/730, 500
See application file for complete search history.

(56) References Cited

U.S. PATENT DOCUMENTS

| | | | | |
|---|---|---|---|---|
| 5,778,960 | A * | 7/1998 | Jackson et al. | 164/98 |
| 5,813,593 | A * | 9/1998 | Galaske, Jr. | 228/112.1 |
| 6,068,541 | A * | 5/2000 | Dwyer | 451/28 |
| 6,273,179 | B1 * | 8/2001 | Geltser et al. | 164/508 |
| 6,391,115 | B1 * | 5/2002 | Marszal et al. | 118/721 |
| 6,444,032 | B1 * | 9/2002 | Bamford | 118/500 |
| 6,551,470 | B1 | 4/2003 | Webb | |
| 6,685,429 | B2 * | 2/2004 | Webster | 415/191 |
| 7,837,843 | B2 | 11/2010 | Sharp et al. | |
| 8,323,409 | B2 * | 12/2012 | Schlichting | C23C 14/042 118/500 |

(Continued)

*Primary Examiner* — David Bryant
*Assistant Examiner* — Darrell C Ford
(74) *Attorney, Agent, or Firm* — Bachman & LaPointe, P.C.

(57) ABSTRACT

A method for coating a turbine engine component comprises the steps of: providing a turbine engine component having at least one sacrificial attachment on a first side; grasping the turbine engine component via the at least one sacrificial attachment to position a first surface of the turbine engine component relative to a source of coating material; and applying a coating to said first side.

12 Claims, 2 Drawing Sheets

(56) References Cited

U.S. PATENT DOCUMENTS

| | | | | |
|---|---|---|---|---|
| 8,962,089 | B2 * | 2/2015 | Schmidt et al. | 427/348 |
| 2003/0057733 | A1 * | 3/2003 | Carson et al. | 296/146.15 |
| 2004/0256807 | A1 * | 12/2004 | Bhate et al. | 277/355 |
| 2005/0247429 | A1 * | 11/2005 | Turkington et al. | 164/516 |
| 2006/0083937 | A1 * | 4/2006 | Burd | F01D 5/288 428/457 |
| 2006/0291996 | A1 * | 12/2006 | Kubota et al. | 415/71 |
| 2007/0044935 | A1 * | 3/2007 | Memmen | B22C 7/02 164/45 |
| 2007/0158200 | A1 * | 7/2007 | Cohen et al. | 205/80 |
| 2007/0221359 | A1 * | 9/2007 | Reilly | 164/516 |
| 2008/0113163 | A1 | 5/2008 | Schlichting et al. | |
| 2008/0280060 | A1 * | 11/2008 | Beaudoin et al. | 427/487 |
| 2009/0035598 | A1 * | 2/2009 | Hanna et al. | 428/550 |
| 2009/0154009 | A1 * | 6/2009 | Le | 360/110 |
| 2009/0276070 | A1 * | 11/2009 | Burkes et al. | 700/98 |
| 2009/0324852 | A1 | 12/2009 | Schlichting et al. | |
| 2010/0112239 | A1 * | 5/2010 | Garimella et al. | 427/600 |
| 2010/0212587 | A1 * | 8/2010 | Sakakibara et al. | 118/621 |
| 2010/0254820 | A1 * | 10/2010 | Maly et al. | 416/241 R |
| 2011/0052406 | A1 * | 3/2011 | Bruce et al. | 416/241 R |
| 2012/0114912 | A1 * | 5/2012 | Bunker et al. | 428/173 |
| 2012/0311780 | A1 * | 12/2012 | Pridemore | 4/633 |
| 2013/0149450 | A1 * | 6/2013 | Feuerstein et al. | 427/282 |
| 2014/0017980 | A1 * | 1/2014 | Edmonson et al. | 451/28 |
| 2014/0090383 | A1 * | 4/2014 | Duelm | 60/752 |
| 2015/0104577 | A1 * | 4/2015 | Doyal | 427/284 |
| 2015/0217316 | A1 * | 8/2015 | Brett | C23C 4/005 427/8 |

* cited by examiner

METHOD AND SYSTEM FOR HOLDING A COMBUSTOR PANEL DURING COATING PROCESS

BACKGROUND

The present disclosure is directed to a method and system for holding a combustor panel during a coating process.

Combustor panels are susceptible to hot corrosion and oxidation attack during service. Many panels experience burn-through before their service interval is met. This leads to the need to replace the panels before the interval is up and causing other inefficiencies in the engine. Metallic coatings are applied to increase the life of the combustor panels. The objective of a typical coating operation is to coat the entire workpiece. However, this is impossible in an overlay coating system without either multiple insertions or touch-coating (slurry coating) afterwards. Aluminide coatings could coat 100% of the part using gas phase or pack technology, but overlay coatings provide better protection. Both of these options add cost and require an extra technical step.

Thus, there is a need for an improved approach for applying overlay coatings to combustor panels.

SUMMARY

In accordance with the present disclosure, there is provided a method for coating a turbine engine component which broadly comprises the steps of: providing a turbine engine component having at least one sacrificial attachment on a first side; grasping the turbine engine component via the at least one sacrificial attachment to position a first surface of the turbine engine component relative to a source of coating material; and applying a coating to the first surface.

In another and alternative embodiment, the method further comprises rotating the turbine engine component by 180 degrees while grasping the turbine engine component via the at least one sacrificial attachment; and applying a coating to a second surface of the turbine engine component opposed to the first surface.

In another and alternative embodiment, the method further comprises removing the at least one sacrificial attachment.

In another and alternative embodiment, the removing step comprises machining the at least one sacrificial attachment.

In another and alternative embodiment, the turbine engine component providing step comprises casting the turbine engine component with a sacrificial attachment located in one of a least vulnerable location on the turbine engine component and a location where the turbine engine component is reinforced.

In another and alternative embodiment, the at least one sacrificial attachment has a threaded end and the grasping step comprises engaging the threaded end.

In another and alternative embodiment, the at least one sacrificial attachment comprises a pair of ears placed along opposite sides of the turbine engine component and the grasping step comprises grasping the ears.

In another and alternative embodiment, the at least one sacrificial attachment is welded to the turbine engine component.

Further, in accordance with the present disclosure, there is provided a system for coating a turbine engine component which broadly comprises: the turbine engine component having at least one sacrificial attachment on at least one side; a source of coating material; and means for grasping the turbine engine component via the at least one sacrificial attachment to position a first surface of the turbine engine component relative to the source of coating material.

In another and alternative embodiment, the turbine engine component is a combustor panel.

In another and alternative embodiment, the at least one sacrificial attachment comprises a stud integrally formed with the turbine engine component.

In another and alternative embodiment, the stud is located on a rear surface of the turbine engine component.

In another and alternative embodiment, the system further comprises a stress concentrator located at a base of said stud.

In another and alternative embodiment, the system further comprises the stud having a threaded end.

In another and alternative embodiment, the grasping means comprises a holder having an opening through which the stud passes and a nut and washer arrangement for engaging the threaded end.

In another and alternative embodiment, the at least one sacrificial attachment comprises a pair of ears attached to opposed edges of the turbine engine component.

In another and alternative embodiment, the grasping means comprises a system for gripping each of the ears.

In another and alternative embodiment, the system further comprises means for rotating the turbine engine component while the at least one sacrificial attachment is being grasped so that a second surface of the turbine engine component is coated.

In another and alternative embodiment, the at least one sacrificial attachment is welded to the turbine engine component.

Other details of the method and system for holding a combustor panel during a coating process are set forth in the following detailed description and the accompanying drawings, wherein like reference numerals depict like elements.

DETAILED DESCRIPTION

Figure 1:
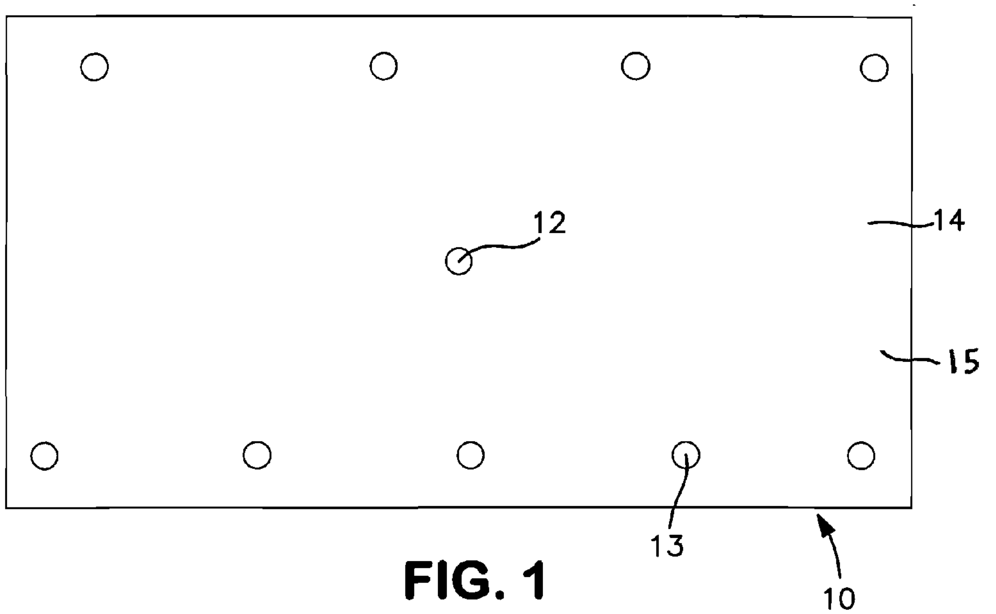
FIG. 1 is a rear view of a turbine engine component having a sacrificial attachment.

Referring now to FIG. 1, there is shown a rear view of a turbine engine component 10 to be coated. The turbine engine component 10 may be a combustor panel. The turbine engine component 10 may be formed from any suitable metallic or ceramic material. The turbine engine component 10 may be a cast structure, a machined structure, or a structure formed by additive manufacturing techniques.

As can be seen from FIGS. 1-4, the turbine engine component 10 may be arcuate in shape. The rear surface 14 of the turbine engine components may have a plurality of non-sacrificial studs 13 projecting out of the rear surface.

The turbine engine component 10 may be formed with one or more sacrificial attachments 12 which can be grasped or held during the coating process. The sacrificial attachment(s) 12 can be integrally formed with the turbine engine component 10 such as by casting the sacrificial attachment(s) with the turbine engine component 10. Each sacrificial attachment 12 may be formed from the same material as the turbine engine component 10 or may be formed from a different material than the material forming the turbine engine component 10. The sacrificial attachment(s) 12 may be located in a non-critical area of the turbine engine component 10. For example, the sacrificial attachment(s) 12 may be located in a least vunerable location on the turbine engine component 10 and/or a location where the turbine engine component 10 is reinforced.

The sacrificial attachment 12 can take the form of a threaded or a non-threaded stud or rod projecting from the rear side 15 of the turbine engine component. The stud or rod may have any shape which is convenient to hold during coating. The sacrificial attachment 12 may be a cast structure which is cast with the turbine engine component 10 or may be a stud or rod welded to the turbine engine component 10.

Figure 2:
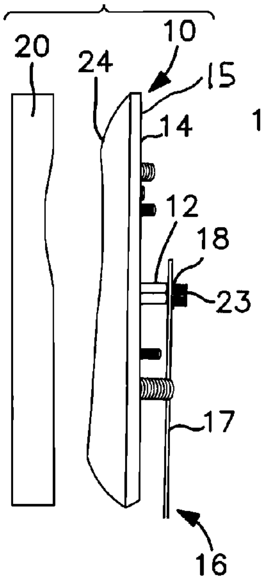
FIG. 2 is a side view of the turbine engine component of FIG. 1 attached to a holding device.
Figure 3:
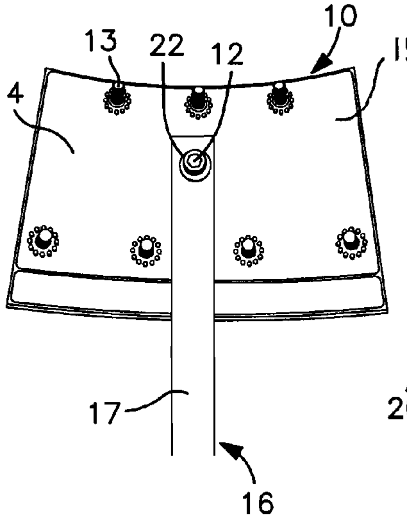
FIG. 3 is a rear view of the turbine engine component and holding device of FIG. 2.
Figure 4:
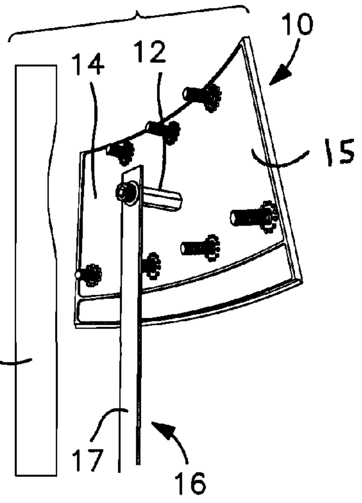
FIG. 4 is a perspective view of the turbine engine component rotated 180 degrees.

Referring now to FIGS. 2-4, the coating device (not shown), such as a cathodic arc coater, may include a member 16 for positioning surfaces of the turbine engine component 10 relative to a source of coating material 20. The positioning member 16 may have at one end a device for grasping the sacrificial attachment(s) 12. For example the positioning member 16 may comprise a bar 17 having an opening 18 for receiving an end of the sacrificial attachment 12. The grasping device may be a washer and nut arrangement 22 for securing the sacrificial attachment 12 to the positioning member 16 if the sacrificial attachment 12 has a threaded end 23. Alternatively, if the sacrificial attachment 12 is unthreaded, it may be provided with a plurality of tabbed protrusions which act as the gripping device. In such a situation, a washer may be placed over the end of the sacrificial attachment 12 and the tabbed protrusions may be folded back to contact the washer surfaces.

During the coating process, the front side 24 of the turbine engine component may initially face a source of coating material 20 until a required coating thickness is achieved on the front surface of the panel. Thereafter, the turbine engine component 10 may be rotated 180 degrees while the turbine engine component 10 is being grasped by the at least one sacrificial attachment 12. If necessary, the turbine engine component 10 may be waved at the source 20 of coating material. The coating process then continues to get coating coverage on the rear side 15 and rear surface 14 of the turbine engine component 10 including around the non-sacrificial studs 13 and the sacrificial attachment(s) 12. In order to rotate the turbine engine component 10, the positioning member 16 may be rotationally connected to the coater.

After the coating process has been completed, the turbine engine component with the sacrificial attachment 12 may be uncoupled from the positioning member 16. If desired, this can be done by cutting or removing the sacrificial attachment 12. The removal or cutting of the sacrificial attachment 12 can be done in any suitable way such as by machining the sacrificial attachment 12 off. Alternatively, the sacrificial attachment 12 may be a breakable tab. The tab may take the form of a single fin which is removable.

Figure 5:
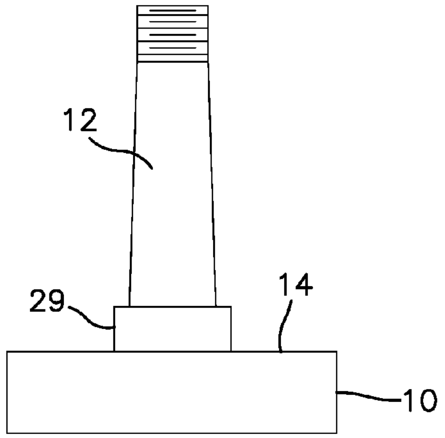
FIG. 5 is a schematic representation of a turbine engine component having a sacrificial attachment with a stress concentrator at its base.

Referring now to FIG. 5, if desired, a stress concentrator 29 may be included at a base of the sacrificial attachment 12. The stress concentrator 29 would allow the sacrificial attachment 12 to be easily removed.

Figure 6:
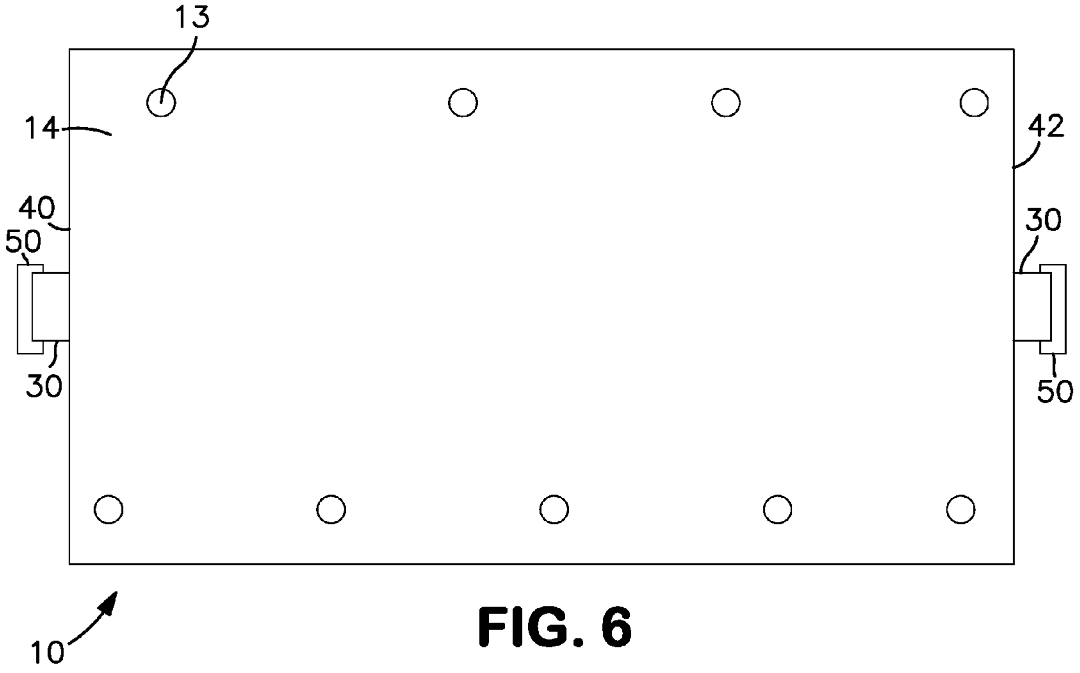
FIG. 6 is a rear view of a turbine engine component wherein the sacrificial attachments are two ears.

Referring now to FIG. 6, instead of the sacrificial attachment 12 being a threaded or unthreaded stud/rod and being located on the rear side of the turbine engine component 10, the sacrificial attachments could be formed by a pair of rectangular ears 30 located on side edges 40 and 42 of the turbine engine component 10. The ears 30 may be integrally formed with the component 10 such as by casting. The ears 30 may be formed from the same material as the turbine engine component 10 or a material compatible with the material forming the turbine engine component 10.

During the coating operation, a suitable holding/positioning device 50 would grasp each of the ears 30 so that the front side 24 of the component 10 initially faces a source of coating material 20. After a coating having a required thickness is deposited on the front surface of the front side 24, the turbine engine component 10 is rotated by 180 degrees so that the rear side 14 faces the source of coating material 20. After a coating of a required thickness has been deposited, the holding/positioning device 50 can be removed from the ears 30. Thereafter, the ears 30 may be machined off or otherwise removed.

The use of the sacrificial attachment(s) 12 or the ears 30 allows for a coating to be applied to turbine engine components 10, such as combustor panels, so that nearly the entire component 10 can be coated with the exception of a relatively small sacrificial area. As noted before, the sacrificial attachment(s) 12 and the ears 30 can be placed in the least vunerable location(s) on the component 10 or in a location or locations where the thickness of the turbine engine component 10 can be reinforced. The addition of the coating to the turbine engine component 10 is beneficial since it will assist the turbine engine component 10 to meet life expectancies and reduce overhaul and replacement costs.

There has been provided in accordance with the instant disclosure a method and system for holding a combustor panel during a coating process. While the method and system have been described in the context of specific embodiments thereof, other unforeseen alternatives, modifications, and variations may become apparent to those skilled in the art having read the foregoing description. Accordingly, it is intended to embrace those alternatives, modifications, and variations as fall within the broad scope of the appended claims.

What is claimed is:

1. A method for coating a turbine engine component comprising the steps of:

providing a turbine engine component having opposed sides and having at least one sacrificial attachment projecting from a rear surface located between said opposed sides and having a plurality of non-sacrificial studs projecting out of the rear surface;

casting said turbine engine component with said at least one sacrificial attachment so that said at least one sacrificial attachment is located in a location where the turbine engine component is reinforced;

grasping said turbine engine component via said at least one sacrificial attachments to position a first surface opposite said rear surface of said turbine engine component relative to a source of coating material;

applying a coating to said first surface;

rotating said turbine engine component by 180 degrees while grasping said turbine engine component via said at least one sacrificial attachment; and applying a coating to said rear surface of said turbine engine component opposed to said first surface.

2. The method of claim 1, further comprising:

removing said at least on sacrificial attachment.

3. The method of claim 2, wherein said removing step comprises machining said at least one sacrificial attachment.

4. The method of claim 1, wherein said at least one sacrificial attachment has a threaded end and said grasping step comprises engaging said threaded end.

5. The method of claim 1, wherein said providing step comprises welding said at least one sacrificial attachment to said turbine engine component.

6. A system for coating a turbine engine component comprising:

said turbine engine component having opposed sides and a rear surface between said opposed sides, a plurality of non-sacrificial studs projecting out of the rear surface, at least one sacrificial attachment projecting from said rear surface, wherein said at least one sacrificial attachment comprises a stud integrally formed with said turbine engine component;

a source of coating material;

means for grasping said turbine engine component via said at least one sacrificial attachment to position a first surface of said turbine engine component relative to said source of coating material so that said first surface may be coated, said first surface located opposite said rear surface; and means for rotating said turbine engine component while said at least one attachment is being grasped so that said rear surface of said turbine engine component may be coated.

7. The system of claim 6, wherein said turbine engine component is a combustor panel.

8. The system of claim 6, further comprising a stress concentrator located at a base of said stud.

9. The system of claim 6, further comprising said stud having a threaded end.

10. The system of claim 9, wherein said grasping means comprises a holder having an opening through which said stud passes and a nut and washer arrangement for engaging said threaded end.

11. The system of claim 6, wherein said at least one attachment is welded to said turbine engine component.

12. The system of claim 6, wherein said at least one sacrificial attachment comprises a rod projecting from said rear surface of said turbine engine component.

* * * * *